(12) United States Patent
Kaur et al.

(10) Patent No.: US 10,432,192 B1
(45) Date of Patent: Oct. 1, 2019

(54) POWER-ON RESET CIRCUIT

(71) Applicant: TEXAS INSTRUMENTS INCORPORATED, Dallas, TX (US)

(72) Inventors: Divya Kaur, Delhi (IN); Rajat Chauhan, Karnataka (IN); Vipul Kumar Singhal, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/110,892

(22) Filed: Aug. 23, 2018

Related U.S. Application Data

(60) Provisional application No. 62/699,482, filed on Jul. 17, 2018.

(51) Int. Cl.
*H03K 17/22* (2006.01)
*H03K 17/14* (2006.01)
*H03K 3/3565* (2006.01)

(52) U.S. Cl.
CPC ......... *H03K 17/223* (2013.01); *H03K 17/145* (2013.01); *H03K 3/3565* (2013.01)

(58) Field of Classification Search
CPC ... H03K 17/223; H03K 17/145; H03K 3/3565
See application file for complete search history.

(56) References Cited

U.S. PATENT DOCUMENTS

2013/0076410 A1* 3/2013 Chen ..................... G06F 1/24
327/143

* cited by examiner

*Primary Examiner* — Daniel C Puentes
(74) *Attorney, Agent, or Firm* — Tuenlap Chan; Charles A. Brill; Frank D. Cimino (57) ABSTRACT

A circuit includes an input stage that includes a first transistor device configured to generate a first output signal in response to a first bias current activating the first transistor device by exceeding a first threshold voltage of the first transistor device. A compensation stage includes a second transistor device coupled with a third transistor device. The second transistor device is activated in response to the first output signal exceeding a second threshold voltage of the second transistor device. The third transistor device is activated in response to activation of the second transistor device and a second bias current. The compensation stage is configured to generate a second output signal in response to the activation of the third transistor device. An output stage is configured to generate a reset signal in response to the second output signal exceeding a third threshold voltage.

19 Claims, 4 Drawing Sheets

POWER-ON RESET CIRCUIT

CROSS REFERENCE TO RELATED APPLICATIONS

This application claims the benefit of U.S. Provisional Patent Application 62/699,482 filed on 17 Jul. 2018, and entitled POWER-ON RESET CIRCUIT AND METHOD, the entirety of which is incorporated by reference herein.

TECHNICAL FIELD

This disclosure relates to electrical circuits, and more particularly to a power-on reset circuit.

BACKGROUND

A power-on reset (POR) circuit is incorporated in an integrated circuit to generate a reset signal in response to detecting power is applied to the integrated circuit. It facilitates that the device starts operating in a known and desired voltage state before releasing the reset signal. In some examples, a simple resistor and capacitor (RC) filter may be applied to control timing of the reset signal. Many power-on situations require more accuracy and deterministic operation over temperature than can be provided by the RC filter. In some circuits, low operating currents may be required to operate the POR circuit. Thus, scaling of resistor values to account for small currents may require too much integrated circuit area and cause long delays before the reset signal is activated by the circuit. Active switching components may be added to the POR circuit to increase switching times however, process and temperature variations between the active components may cause circuit timing inaccuracies among other undesired characteristics.

SUMMARY

This disclosure relates to a power-on reset circuit.

In one example, a circuit includes an input stage that includes a first transistor device configured to generate a first output signal in response to a first bias current activating the first transistor device by exceeding a first threshold voltage of the first transistor device. A compensation stage includes a second transistor device coupled with a third transistor device. The second transistor device is activated in response to the first output signal exceeding a second threshold voltage of the second transistor device. The second transistor device is configured to set the second threshold voltage to compensate for process and temperature variations of the first transistor device. The third transistor device is activated in response to activation of the second transistor device and a second bias current. The compensation stage is configured to generate a second output signal in response to the activation of the third transistor device. An output stage is configured to generate a reset signal voltage in response to the second output signal exceeding a third threshold voltage.

In another example, a circuit includes a first transistor device having a gate coupled to a drain thereof and a source coupled to a first voltage rail. A first current source is coupled between a second voltage rail and the drain of the first transistor device. A second transistor device includes a gate that is coupled to the drain of the first transistor device. The second transistor device has a drain coupled to the second voltage rail. A third transistor device having a gate coupled to a drain thereof and a source coupled to the source of the second transistor device. A second current source is coupled between the drain of the third transistor device and the first voltage rail. A fourth transistor device having a gate terminal is coupled to the gate terminal of the third transistor device. The fourth transistor device has a source terminal coupled to the second voltage rail and a drain terminal coupled to a third current source.

In yet another example, a method includes biasing a first transistor device by a first bias current to provide a first output voltage. The method includes activating a second transistor device in response to the first output voltage of the first transistor device. The method includes activating a third transistor device coupled to the second transistor device to provide a third output signal in response to the activation of the second transistor device and a second bias current. The method includes activating a fourth transistor device to provide a reset signal voltage in response to the third output signal of the second transistor device and a third bias current. At least one of the bias currents is adjusted to compensate the reset signal voltage over a temperature range.

DETAILED DESCRIPTION

This disclosure relates to a power-on reset circuit. The power-on reset circuit monitors an operating voltage for downstream circuits (e.g., microprocessor circuits) in a supervisory mode and releases a reset signal when the operating voltage is within a desired operating range. Various circuit stages are provided to enable fast and reliable power-on switching speeds of the reset circuit utilizing low operating currents in the nanoampere range while also providing consistent switching performance over process and/or temperature variations. The circuit includes an input stage that includes a first transistor device configured to generate an output signal in response to a bias current activating the first transistor device by exceeding a threshold voltage of the first transistor device. A current source that provides the bias current to the first transistor device may be coupled to a high voltage rail. For example, the first transistor device may be an n-channel device such as having a positive threshold voltage. A compensation stage includes a second transistor device coupled with a third transistor device.

The second transistor device is activated in response to the output signal from the input stage subtracting the threshold voltage of the second transistor device. The second transistor device is configured such that it compensates for process variations of the first transistor device. In an example, if the first transistor device has a positive threshold Vth1 and a correlated device with a threshold voltage Vth2 for the second transistor is used, it would compensate for the process variation for the first transistor device. Such transistors can be fabricated in conjunction with each other on a silicon substrate (e.g., in an IC) and thus, if one transistor's threshold increase in one direction, the other compensating transistor's threshold would also increase in the same direction thus providing process compensation for the first transistor device.

For the purpose of the circuit described herein, to facilitate that there is no false tripping, the second transistor device in the compensation stage provides a negative threshold voltage (or a threshold voltage close to zero). The third transistor device in the compensation stage can be activated in response to activation of the second transistor device and a second bias current. The compensation stage can be configured to generate a second output signal. An output stage can be configured to generate a reset signal in response to the supply voltage exceeding the second output signal by the third threshold voltage. Process parameters such as bias current adjustments and/or transistor parameters including width and length parameters can be provided to allow for switching performance of the reset circuit to be tailored over operating temperature ranges.

As used herein, the term "circuit" can include a collection of active and/or passive elements that perform a circuit function, such as an analog circuit. Additionally or alternatively, for example, the term "circuit" can include an integrated circuit (IC) where all or some of the circuit elements are fabricated on a common substrate (e.g., semiconductor substrate, such as a die or chip).

Figure 1:
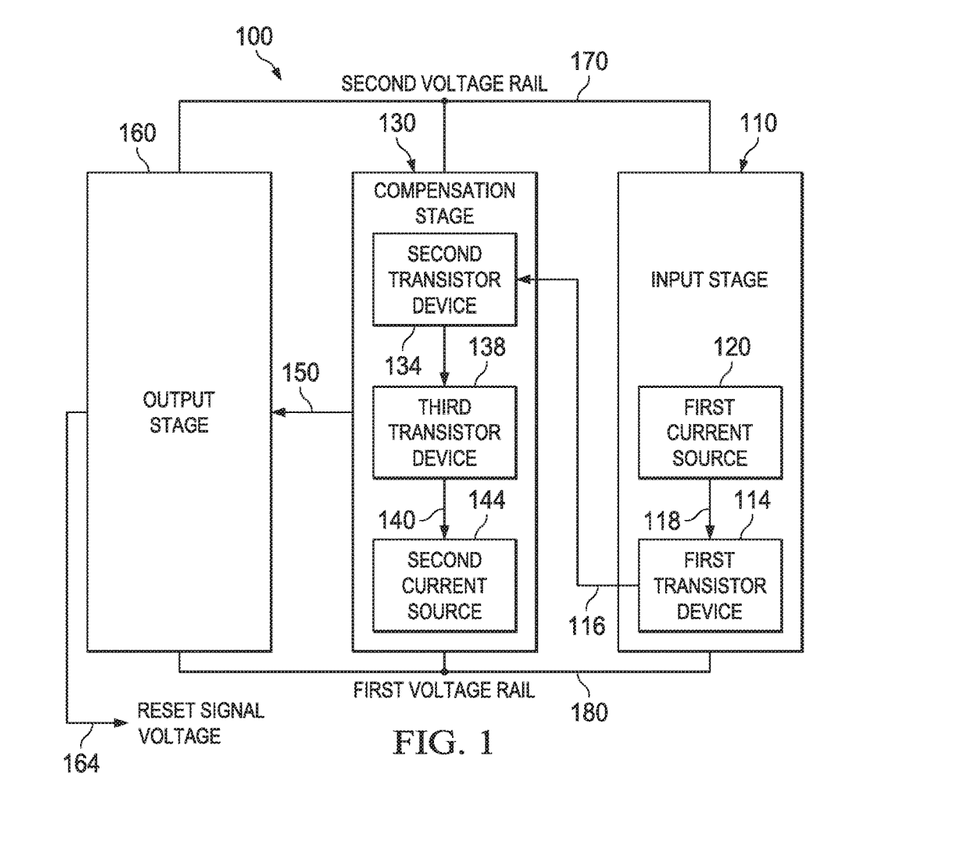
FIG. 1 illustrates an example block diagram of a circuit to provide a power-on reset signal.

FIG. 1 illustrates an example of a circuit 100 to provide a power-on reset signal voltage. The circuit 100 includes an input stage 110 that includes a first transistor device 114 configured to generate a first output signal 116 in response to a first bias current 118 from a first current source 120 activating the first transistor device by exceeding a first threshold voltage of the first transistor device. A compensation stage 130 includes a second transistor device 134 coupled with a third transistor device 138. The second transistor device 134 is activated in response to the first output signal 116 exceeding a second threshold voltage of the second transistor device. The second transistor device 134 is configured to compensate for process and temperature variations of the first transistor device. For example, if the first transistor device's 114 threshold voltage increases in a given process fabrication, the second transistor device 134 is configured to correspondingly increase during the given process fabrication and vice versa. The third transistor device 138 is activated in response to activation of the second transistor device 134 and a second bias current 140 set by a second current source 144.

The compensation stage 130 is configured to generate a second output signal 150 in response to the activation of the third transistor device 138. An output stage 160 is configured to generate a reset signal voltage 164 in response to the second output signal 150 exceeding a third threshold voltage (e.g., of another transistor device—not shown). As shown, a voltage rail 170 (also referred to as second voltage rail) (e.g., VDD) can supply power to the respective stages 110, 130, and 160, and a voltage rail 180 (also referred to as first voltage rail) (e.g., VSS) can provide a return path (e.g., electrical ground) for each of the respective stages.

By way of example, the reset signal voltage 164 varies as a function of the threshold voltage of each transistor device in the circuit 100. The reset signal voltage 164 also varies as a function of temperature in the circuit 100. Various equations are provided below with respect to FIG. 2 that illustrate the voltage threshold and temperature relationships for the reset signal voltage 164. At least one of the w and 1 parameters of one or more of the transistor devices can configured to adjust a trip point of the circuit. In another example, at least one of the bias currents described herein can be adjusted to implement corresponding temperature correction of the circuit 100 according to the temperature coefficient correction term. A Schmitt Trigger (see e.g., FIG. 2) can be provided to buffer the reset signal voltage 164.

Each of the bias currents described herein can be generated by a separate current source configured to generate each bias current. As an example, each such current source can include an input connected to a drain of a corresponding transistor device, a resistor connected at one end of a source of the corresponding transistor device, and another end of the resistor connected to a base of the corresponding transistor device (see, e.g., of FIG. 3). In yet another example, the input stage 110 can include at least one other transistor device coupled in series with the first transistor device 114 to increase the threshold voltage level of the input stage (see e.g., FIG. 4). Thus, the compensation stage 130 can include at least one other compensation transistor device cascaded to the second transistor device to provide process compensation for the at least one other transistor device in the input stage 110 (see, e.g., FIG. 4).

Since the bias current sources are generated using a transistor device (see e.g., FIG. 4), the circuit 100 is self-powering from the second voltage rail 170 alone and hence no start up circuitry is required. Here, the reset signal voltage 164 is generated based on the voltage comparison between the source voltage and gate voltage of the final output transistor device in the output stage 160 (e.g., see M4 of FIG. 2). Low quiescent current (Iq) which represents a leakage current of the circuit 100 and derived from the start-up voltage of the second voltage rail makes almost no impact on the delay and thus, the circuit 100 is very fast due to the coupled nature of transistor devices between stages and without intervening resistance paths. The current is limited by the negative threshold of the transistor device in the respective current sources and since that is quite small, the resistors employed in the respective current sources are of a smaller value thereby saving silicon circuit area.

Figure 2:
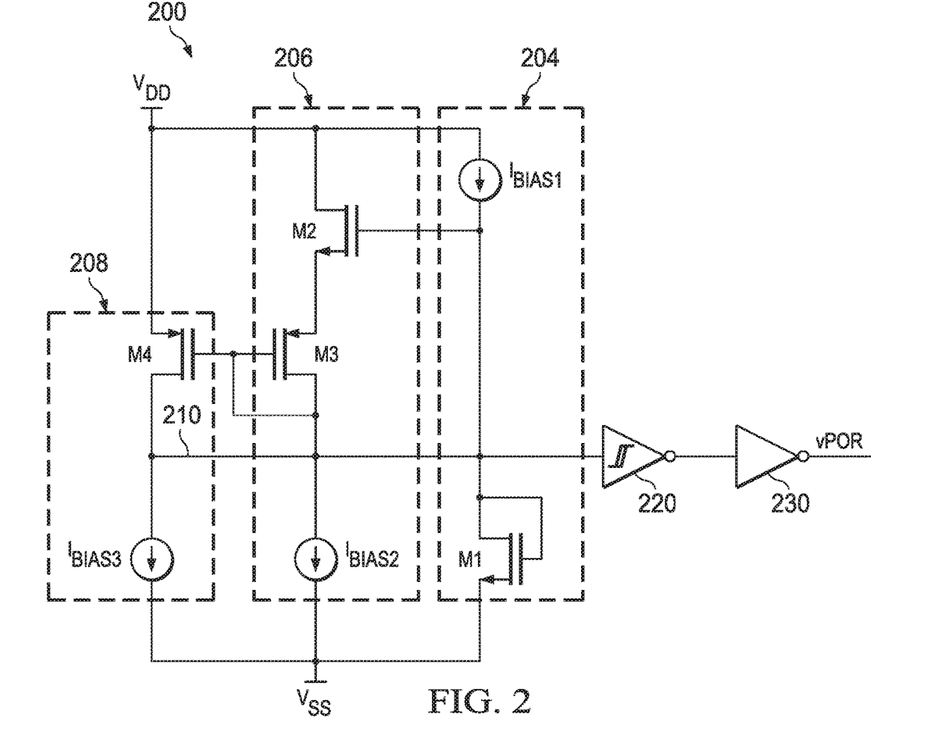
FIG. 2 illustrates an example circuit diagram of a circuit to provide a power-on reset signal.

FIG. 2 illustrates an example of a circuit 200 to provide a power-on reset signal voltage ($V_{POR}$). Similar to the circuit 100 illustrated and described above with respect to FIG. 1, the circuit 200 includes an input stage 204, a compensation stage 206, and an output stage 208. In this example, the circuit 200 includes a first transistor device M1 having a gate coupled to a drain thereof (e.g., a diode-connected transistor) and the source of M1 is coupled to another voltage rail, shown as $V_{SS}$ in this example. A first current source $I_{BIAS1}$ is coupled between a voltage rail, shown as $V_{DD}$ in this example, and the drain of the first transistor device M1.

In the compensation stage 206, a second transistor device M2 includes a gate that is coupled to the drain of the first transistor device M1. The second transistor device M2 has a drain coupled to the voltage rail VDD. A third transistor device M3 has a gate coupled to a drain thereof (e.g., a diode-connected transistor) and a source of M3 coupled to the source of the second transistor device M2. A second current source $I_{BIAS2}$ is coupled between the drain of the third transistor device M3 and the voltage rail $V_{SS}$.

The output stage 208 includes a fourth transistor device M4 having a gate terminal is coupled to the gate terminal of the third transistor device M3. The fourth transistor device M4 also has its source terminal coupled to the high voltage rail $V_{SS}$ and a drain terminal coupled to a third current source $I_{BIAS3}$. The drain of M4 provides a reset signal voltage 210 which is utilized to provide a power-on reset signal ($V_{POR}$), such as described herein. In the example of FIG. 2, the reset signal voltage can be buffered by Schmitt Trigger 220 and further conditioned by buffer 230 to generate $V_{POR}$ for downstream circuitry (not shown).

As mentioned previously, the drain terminal of the fourth transistor device M4 provides the reset signal voltage 210 of the circuit 200 that varies a function of the threshold voltage of each device. The reset signal voltage 210 is based off a comparison between the source voltage and gate voltage of M4. For the example of FIG. 2, the reset signal voltage 210 may be expressed as shown in Eq. 1. As an example, the reset signal ($V_{POR}$) may be expressed as follows:

$$VPOR = Vth1st - Vth2nd - Vth3rd + Vth4th + \eta * Vt * \ln\left(\frac{Ibias3 * Ibias1}{Ibias2^2} * \frac{\beta eff2nd * \beta eff3rd}{\beta eff1st * \beta eff4th}\right), \quad \text{Eq. 1}$$

where

Vth1st is a threshold voltage for the first transistor device, M1,

Vth2nd is a threshold voltage for the second transistor device, M2,

Vth3rd is a threshold voltage for the third transistor device, M3,

Vth4th is a threshold voltage for the fourth transistor device, M4

$\eta$ is the subthreshold slope factor (e.g., between about 1 and about 1.5),

Vt is a constant comprising the Boltzman constant, absolute temperature, and charge (q), and ln denotes a natural logarithm, Ibias1 is the first bias current, Ibias2 is the second bias current, Ibias3 is the third bias current, Beff1 st is a transistor gain term affected by the width (w) and length (l) parameter of the first transistor device, Beff2nd is a transistor gain term affected by the w and l parameter of the second transistor device, Beff3rd is a transistor gain term affected by the w and l parameter of the third transistor device, and Beff4th is a transistor gain term affected by the w and l parameter of the fourth transistor device. The term $$\eta * Vt * \ln\left(\frac{Ibias3 * Ibias1}{Ibias2^2} * \frac{\beta eff2nd * \beta eff3rd}{\beta eff1st * \beta eff4th}\right)$$

is also referred to as the temperature coefficient correction term (Tempco) described herein.

Since the threshold terms in Eq. 1 appear in a differential state—both for the correlated PMOS and NMOS devices described herein—when the VPOR signal is set, the process and temperature variations in the transistor devices are mitigated since the correlated devices (e.g., correlated by using similar fabrication processes) track each other over temperature such as shown in Equation 1. In one example, the second transistor device 134 can be a negative threshold transistor device or a depletion mode transistor device. Additionally, the reset signal voltage 164 can be made as a desired function of a temperature by adjusting the temperature coefficient correction term (TempCo) (e.g., terms in Equation 1 not related to threshold voltages).

The first transistor device M1 can be an n-channel device having a positive threshold voltage, the second transistor device M2 can be an n-channel device having a negative threshold voltage and configured to compensate for process variations of the threshold of the first transistor device. The third transistor device and the fourth transistor device can be a p-channel device, for example. M2 is also configured by its negative threshold to mitigate false tripping of the circuit 200. In some examples, at least one of the w and l parameters of at least one of the transistor devices MP1, MP2, MP3, and MP4 can be configured to adjust the respective Beff terms (e.g., set in the design and layout of the IC chip implementing the devices) and/or voltage thresholds for the respective devices.

Additionally or alternatively, one or more of the bias currents $I_{BIAS1}$, $I_{BIAS2}$, and $I_{BIAS3}$ can be set (e.g., by configuring respective current sources) to adjust the operating behavior with respect to temperature. For example, by adjusting one or more Beff parameters and/or $I_{BIAS}$ parameters of Equation 1, the temperature variation may be mitigated (e.g., net TempCo can approximate zero). Thus, a positive TempCo can be configured, a negative TempCo can be configured, or a flat TempCo can be configured based on adjustments to Beff for each transistor device and/or current source supplying the respective devices. When VDD reaches a threshold, $I_{BIAS1}$ supplies current to turn on M1. When M1's drain terminal reaches a threshold, M2 turns on which then turns on M3 acting as a diode. This in turn engages M4 which when on, pulls-up its output at 210 to VDD. When 210 is pulled high, it is inverted by Schmitt trigger 220 and again inverted by the buffer 230 to generate VPOR.

Figure 3:
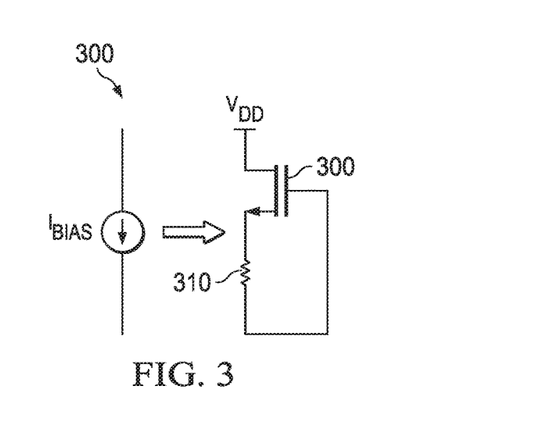
FIG. 3 illustrates an example of a bias circuit of FIG. 2.

FIG. 3 illustrates an example of a bias circuit of FIG. 2. In this example, an example bias source IBIAS is shown implemented as a transistor device 300 and resistor 310 combination however, other current source implementations are possible. For example, the IBIAS source that includes transistor device 300 and resistor 310 can be used to drive transistor M1, such as shown in FIG. 2. The transistor device 300 acts as the current source comprising an input connected to a drain of the corresponding transistor device. The resistor 310 is connected at one end of a source of the corresponding transistor device 300 and another end of the resistor is connected to a base of the corresponding transistor device. By implementing the bias circuit in this manner, a relatively small resistor value can be employed at 310 to reduce circuit real-estate over since the transistor device 300 provides the desired bias current due to its respective threshold voltage.

Figure 4:
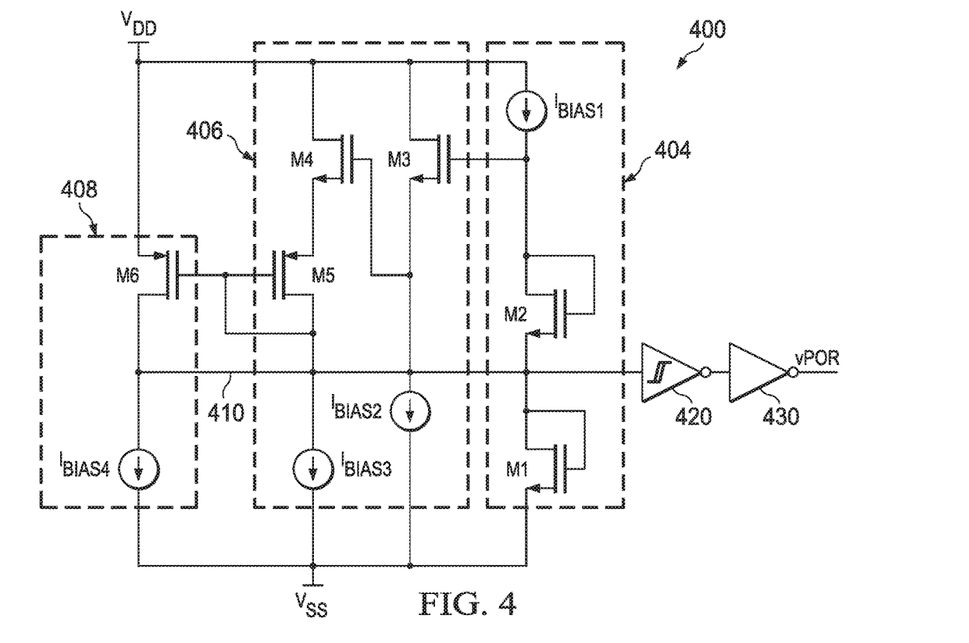
FIG. 4 illustrates an example circuit diagram of a circuit that employs elevated trip threshold levels to provide a power-on reset signal.

FIG. 4 illustrates an example circuit 400 that employs elevated trip threshold levels to provide a corresponding power-on reset signal voltage. Similar to the examples previously described herein, the circuit 400 includes an input stage 404, a compensation stage 406, and an output stage 408. The input stage 404 includes transistor devices M1 and M2 connected in series to a current source that provides a corresponding bias current $I_{BIAS1}$. The transistor devices M1 and M2 provide a combined threshold voltage that raises the overall reset trip threshold level of the circuit 400. The compensation stage 406 includes transistor devices M3 and M4 which provide false trip and process compensation (e.g., fabricated in similar silicon process and having threshold values tracking but opposite of M1 and M2) for the threshold voltages of M1 and M2, respectively. The transistor device M3 is connected to a current source configured to provide a corresponding bias current $I_{BIAS2}$ whereas transistor device M4 is connected to M5 which is in turn connected to current source configured to provide a corresponding bias current $I_{BIAS3}$. The gate and drain of M5 is connected to a gate of M6 in the output stage 408, where M6 is connected to current source configured to provide a corresponding bias current $I_{BIAS4}$. The drain of M6 drives a reset signal voltage 410 which can be buffered by Schmitt trigger 420 and further buffered by inverter 430 to generate a power-on reset signal $V_{POR}$.

Thus, in this example, the input stage 404 includes one or more other transistor devices (e.g., M2) coupled in series with the first transistor device (e.g., M1) to increase the threshold voltage level of the input stage. The compensation stage 406 includes one or more other compensation transistor devices (e.g., M3) cascaded to the second transistor device (e.g., M4) to provide false tripping and process compensation for the at least one other transistor device (e.g., M2) in the input stage 404. Thus, by implementing M1 and M2 as diode connected transistor devices and including subsequent source followers M3 and M4 in the compensation stage, the circuit 400 is afforded trip point adjustment while also cancelling out process variations. For example, trip point adjustment can be made by using multiple diode connected NMOS transistor devices such as M1 or combination of normal and negative voltage threshold NMOS devices in the first stage and adding subsequent negative voltage threshold-based source followers before and/or within the compensation stage 406 to cancel out the variations over temperature since one threshold will increase while the other decreases over a given temperature range. In place of using negative threshold PMOS such as M5, a source follower stage with a PMOS device (having nominal zero or positive voltage threshold) can also be incorporated. Similar to the circuit of FIG. 2 above, when VDD reaches a threshold, $I_{BIAS1}$ supplies current to turn on M1 and M2. When M2's drain terminal reaches a threshold, M3 turns on which turns on M4 when M3's drain exceeds a threshold for M4. M4 turns on which then turns on M5 acting as a diode. This in turn engages M6 which when on, pulls-up its output at 410 to VDD. When 410 is pulled high, it is inverted by Schmitt trigger 420 and again inverted by the buffer 430 to generate VPOR.

Figure 5:
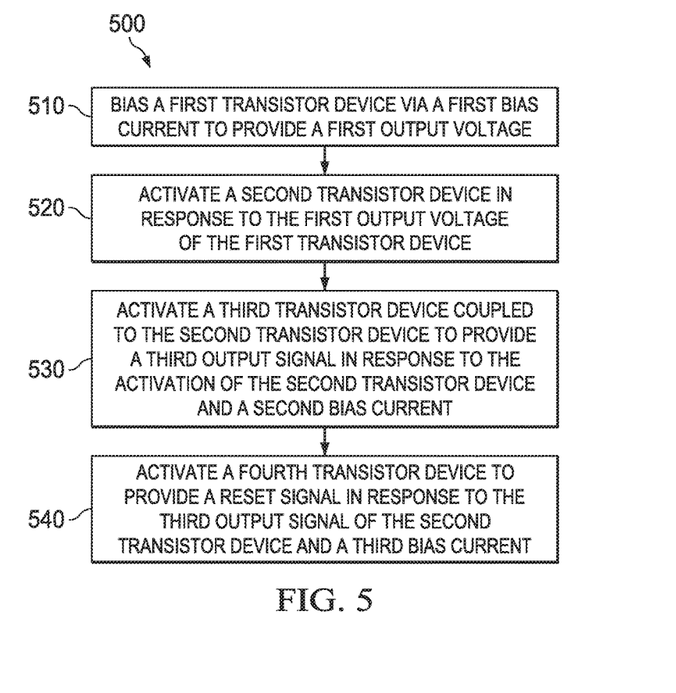
FIG. 5 illustrates an example of a method to generate a power-on reset signal.

In view of the foregoing structural and functional features described above, an example method will be better appreciated with reference to FIG. 5. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various hardware circuits, such as including those disclosed herein, for example.

FIG. 5 illustrates an example of a method 500 to generate a power-on reset signal voltage. At 510, the method 500 includes biasing a first transistor device by a first bias current to provide a first output voltage. At 520, the method 500 includes activating a second transistor device in response to the first output voltage of the first transistor device. At 530, the method 500 includes activating a third transistor device coupled to the second transistor device to provide a third output signal in response to the activation of the second transistor device and a second bias current. At 540, the method 500 includes activating a fourth transistor device to provide a reset signal voltage in response to the third output signal of the second transistor device and a third bias current. At least one of the bias currents is adjusted to compensate the reset signal voltage over a temperature range.

The reset signal voltage can vary as a function of the threshold voltage of each device such that the reset signal voltage is adjusted according to Equation 1 described above with respect to FIG. 2 that describes how the threshold voltages between transistor devices are combined to generate the reset signal voltage. Also, temperature adjustments can be made with respect to the Beff term for the respective transistor devices and/or for the associated current sources driving the devices according to Equation 1, described above with respect to FIG. 2.

Figure 6:
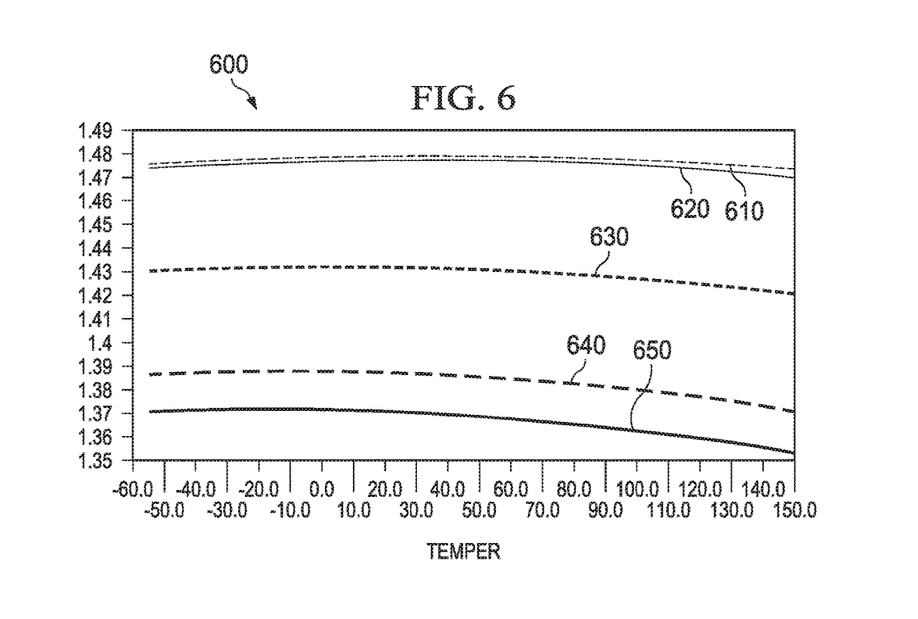
FIG. 6 illustrates power on trip voltage thresholds with respect to temperature as process transistor parameters are varied.

FIG. 6 is a diagram 600 that illustrates power on trip voltage thresholds with respect to temperature as process transistor parameters are varied. The Y axis of the diagram 600 represents the POR trip Voltage in volts and the X axis represents temperature. Each of the lines 610, 620, 630, 640, and 650 represents a respective process corner. As used herein, the term process corner is an example of a design-of-experiment (DoE) that refers to a variation of fabrication parameters used in applying an integrated circuit design to a semiconductor wafer. Process corners represent the extremes of these parameter variations within which a circuit that has been etched onto the wafer should function correctly. At 630, the process corner indicates a model threshold path through the circuits described herein where process parameters for the respective transistor devices are set for the nominal case. At 650, in a strong corner example, the threshold voltage of an NMOS device will be low, mobility will be high and so on implying a higher drive strength. At 610, a weak corner example is shown where the threshold voltage of the NMOS device will be high, mobility will be low and so on implying a lower drive strength. At 620 and 640, skewed corners show either one of the PMOS or NMOS is strong and the other weak.

Advantageously, the circuits shown in FIGS. 2 and 4 can operate with desired power on trip voltage threshold over the transistor parameter variations, such as illustrated in FIG. 6. This is due to the compensation stage described herein having a threshold that is opposite of the input stage which mitigates false-tripping over temperature. Also, by fabricating the input stage transistor device and the compensation stage transistor devices in the same area and process manufacturing conditions for the die, such voltage threshold performance as illustrated in FIG. 6 can also be provided over desired temperature ranges.

Figure 7:
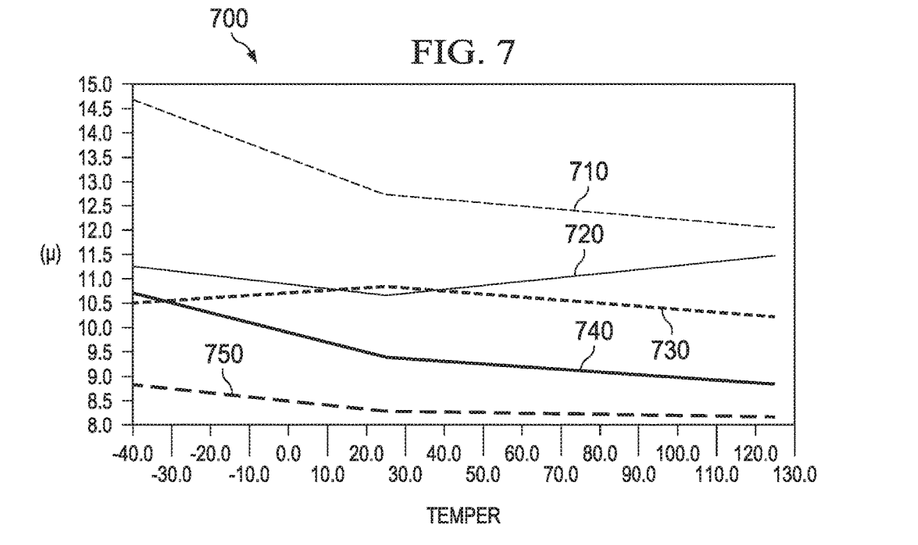
FIG. 7 illustrates circuit delay times between when a power rail reaches voltage threshold to the time a power on reset signal is asserted.

FIG. 7 is a diagram 700 that illustrates circuit delay times between when a power rail reaches voltage threshold to the time a power on reset signal is asserted. The Y axis of the diagram 700 represents the POR trip Voltage delay in microseconds and the X axis represents temperature. Each of the lines 710, 720, 730, 740, and 750 indicates a respective process corner. The time indicated on the Y axis represents the delay when the VDD crosses the PoR trip point to the time the POR voltage reaches a threshold. At 730, the process corner indicates a model threshold timing path through the circuits described herein where process parameters for the respective transistor devices are set for the nominal case. At 750, in a strong corner example, the threshold voltage of an NMOS device will be low, mobility will be high and so on implying a higher drive strength which affects circuit timing as shown. At 710, a weak corner example is shown where the threshold voltage of the NMOS device will be high, mobility will be low and so on implying a lower drive strength which affects circuit timing as shown.

At 720 and 740, skewed corners show either one of the PMOS or NMOS is strong and the other weak.

Similar to the advantages described above with respect to FIG. 6, the circuits shown in FIGS. 2 and 4 can operate with desired delay times over the transistor parameter variations illustrated in FIG. 6. This is due to the compensating transistor configurations designed herein where low resistance values can be employed in the respective circuits. Low resistance values can be employed due to the process compensation described herein between the input stage and the compensation stage and also by utilizing alternating positive and negative thresholds in the input stage and compensation stage to mitigate false-tripping as described herein.

What have been described above are examples. It is, of course, not possible to describe every conceivable combination of components or methods, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
    an input stage that includes a first transistor device configured to generate a first output signal in response to a first bias current activating the first transistor device by exceeding a first threshold voltage of the first transistor device;
    a compensation stage that includes a second transistor device coupled with a third transistor device, the second transistor device being activated in response to the first output signal exceeding a second threshold voltage of the second transistor device, the second transistor device configured to set the second threshold voltage to compensate for process and temperature variations of the first transistor device, the third transistor device being activated in response to activation of the second transistor device and a second bias current, the compensation stage configured to generate a second output signal in response to the activation of the third transistor device; and
    an output stage configured to generate a reset signal voltage in response to the second output signal exceeding a third threshold voltage.

2. The circuit of claim 1, wherein the output stage further comprising a fourth transistor device configured to generate the reset signal voltage in response to the second output signal and a third bias current.

3. The circuit of claim 2, wherein the reset signal voltage is based on summation of the threshold voltages of each of the first, second, third and fourth transistor devices.

4. The circuit of claim 3, wherein the second transistor device is a negative threshold transistor device or a depletion mode transistor device.

5. The circuit of claim 3, wherein the reset signal voltage further varies as a function of a temperature coefficient correction term that varies as a function of each of the bias currents and a gain of each of the transistor devices.

6. The circuit of claim 5, wherein the first transistor device is an n-channel device having a positive threshold voltage and the second transistor device is an n-channel device correlated to the first transistor device to compensate for process variations of the threshold voltage of the first transistor device.

7. The circuit of claim 5, wherein the third transistor device and the fourth transistor device is a p-channel device.

8. The circuit of claim 5, wherein at least one of a width parameter or a length parameter of at least one of the transistor devices is configured to adjust a trip point of the circuit.

9. The circuit of claim 5, wherein at least one of the bias currents is adjusted to implement corresponding temperature correction of the circuit according to the temperature coefficient correction term.

10. The circuit of claim 1, further comprising a Schmitt Trigger to buffer the reset signal voltage.

11. The circuit of claim 1, wherein each of the bias currents is generated by a separate current source to generate each bias current, each separate current source comprising an input connected to a drain of a corresponding transistor device, a resistor connected at one end of a source of the corresponding transistor device, and another end of the resistor connected to a gate of the corresponding transistor device.

12. The circuit of claim 1, wherein the input stage further comprises at least one other transistor device coupled in series with the first transistor device to increase a threshold voltage level of the input stage, the compensation stage including at least one other compensation transistor device cascaded to the second transistor device to provide process compensation for the at least one other transistor device in the input stage.

13. A circuit, comprising:
    a first transistor device having a gate coupled to a drain thereof and a source coupled to a first voltage rail;
    a first current source coupled between a second voltage rail and the drain of the first transistor device;
    a second transistor device that includes a gate that is coupled to the drain of the first transistor device, the second transistor device having a drain coupled to the second voltage rail;
    a third transistor device having a gate coupled to a drain thereof and a source coupled to the source of the second transistor device;
    a second current source coupled between the drain of the third transistor device and the first voltage rail; and
    a fourth transistor device having a gate terminal coupled to the gate terminal of the third transistor device, the fourth transistor device having a source terminal coupled to the second voltage rail and a drain terminal coupled to a third current source.

14. The circuit of claim 13, wherein the drain terminal of the fourth transistor device provides a reset signal voltage of the circuit that is based on summation of the threshold voltages of each of the first, second, third and fourth transistor devices.

15. The circuit of claim 14, wherein the reset signal voltage further varies as a function of a temperature coefficient correction term that varies as a function of each of the bias currents and a gain of each of the transistor devices.

16. The circuit of claim 15, wherein at least one a width parameter or a length parameter of at least one of the transistor devices is adjusted to adjust the temperature coefficient correction term or at least one of the bias currents is adjusted to adjust the temperature coefficient correction term.

17. The circuit of claim 15, wherein each of the current sources include an input connected to a drain of a corresponding transistor device, a resistor connected at one end of a source of the corresponding transistor device, and another end of the resistor connected to a base of the corresponding transistor device.

18. A method, comprising:
- biasing a first transistor device by a first bias current to provide a first output voltage;
- activating a second transistor device in response to the first output voltage of the first transistor device;
- activating a third transistor device coupled to the second transistor device to provide a third output signal in response to the activation of the second transistor device and a second bias current; and
- activating a fourth transistor device to provide a reset signal voltage in response to the third output signal of the second transistor device and a third bias current, wherein at least one of the bias currents is adjusted to compensate the reset signal voltage over a temperature range,
- wherein the reset signal voltage is based on summation of the threshold voltages of each of the first, second, third and fourth transistor devices and of a temperature coefficient correction term that varies as a function of each of the bias currents and a gain of each of the transistor devices.

19. The circuit of claim 18, further comprising adjusting at least one of a width parameter or a length parameter of at least one of the transistor devices to adjust the temperature coefficient correction term or adjusting at least one of the bias currents to adjust the temperature coefficient correction term.

* * * * *